(12) United States Patent
Yoneda et al.

(10) Patent No.: US 6,271,617 B1
(45) Date of Patent: *Aug. 7, 2001

(54) SURFACE ACOUSTIC WAVE DEVICE WITH A TUNGSTEN-ALUMINUM LAYERED INTERDIGITAL TRANSDUCER

(75) Inventors: Toshimaro Yoneda, Nagaokakyo; Michio Kadota, Kyoto, both of (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,509

(22) Filed: Aug. 26, 1998

(30) Foreign Application Priority Data

Aug. 28, 1997 (JP) .................................................. 9-249531

(51) Int. Cl.⁷ ...................................................... H03H 9/25
(52) U.S. Cl. ................................... 310/313 D; 310/313 R
(58) Field of Search ........................... 310/313 R, 313 B, 310/313 C, 313 D

(56) References Cited

U.S. PATENT DOCUMENTS

| | | | |
|---|---|---|---|
| 4,544,857 | * 10/1985 | Shimizu et al. | 310/313 B |
| 4,942,327 | * 7/1990 | Watanabe et al. | 310/313 R |
| 5,144,185 | * 9/1992 | Yuhara et al. | 310/313 B |
| 5,152,864 | * 10/1992 | Ieki et al. | 117/108 |
| 5,162,690 | * 11/1992 | Ieki et al. | 310/313 R |
| 5,453,652 | 9/1995 | Eda et al. | 310/313 R |
| 5,844,347 | * 12/1998 | Takayama et al. | 310/313 R |
| 5,847,486 | * 12/1998 | Kadota et al. | 310/313 R |
| 5,909,156 | * 6/1999 | Nishihara et al. | 333/193 |

FOREIGN PATENT DOCUMENTS

| | | | |
|---|---|---|---|
| 63-260213 | 10/1988 | (JP) | H03H/9/145 |
| 8-125485 | 5/1996 | (JP) | H03H/9/145 |
| 8-250966 | 9/1996 | (JP) | H03H/9/145 |
| 10-247835 | * 9/1998 | (JP) | 310/313 B |

OTHER PUBLICATIONS

Japanese Patent Abstract of 5–63496, "Surface Acoustic Wave Device" (Mar. 1993).
Japanese Patent Abstract of 9–107268, "Ladder type Surface Acoustic Wave Filter" (Apr. 1997).
Technical Report of Institute of Electronics, Information and Communication Engineers (IEICE) US 82–35, 1982.
Technical Report of Institute of Electronics, Information and Communication Engineers, US 86–37, 1986.

* cited by examiner

Primary Examiner—Thomas M. Dougherty
(74) Attorney, Agent, or Firm—Keating & Bennett, LLP

(57) ABSTRACT

A surface acoustic wave device includes a surface acoustic wave substrate and an interdigital transducer provided on the surface acoustic wave substrate and including a laminated metal film in which a tungsten layer and an aluminum layer are laminated.

20 Claims, 10 Drawing Sheets

SURFACE ACOUSTIC WAVE DEVICE WITH A TUNGSTEN-ALUMINUM LAYERED INTERDIGITAL TRANSDUCER

BACKGROUND OF THE INVENTION

1. Field of the Invention

The present invention relates to a surface acoustic wave device having an interdigital transducer (hereinafter referred to as IDT) disposed on a surface acoustic wave substrate and, more particularly, to a surface acoustic wave device using Love waves.

2. Description of the Related Art

A variety of surface acoustic wave devices utilizing surface acoustic waves have been proposed. For example, the Technical Report of the Institute of Electronics, Information and Communication Engineers (IEICE), pp. 7–14, US 82-35, 1982 discloses a surface acoustic wave device in which a thin layer of a slow acoustic speed material is formed on a rotational Y-cut, X-propagated $LiNbO_3$ substrate, wherein a pseudo surface acoustic wave produced therein is a Love-wave type surface acoustic wave which is free from transmission attenuation.

The Technical Report of Institute of Electronics, Information and Communication Engineers, pp. 31–38, US 86-37, 1986 discloses a rotational Y-cut, X-propagated $LiNbO_3$ substrate, which has no single uniformly arranged film disposed thereon but has metal strips intermittently arranged thereon to generate Love waves.

Japanese Laid-Open Patent Publication No. 63-260213 discloses a surface acoustic wave device which uses Love waves and which comprises a rotational Y-cut, X-propagated $LiNbO_3$ substrate having an IDT constructed of a heavy metal such as gold, silver, or platinum.

Japanese Laid-open Patent Publication No. 8-125485 discloses a surface acoustic wave device which uses Love waves and which comprises an IDT constructed of tungsten or tantalum, provided on a surface acoustic wave substrate.

Japanese Laid-Open Patent Publication No. 8-250966 discloses a surface acoustic wave device which uses Love waves and which comprises an IDT of two layers of Ta/Al provided on a surface acoustic substrate.

Although Technical Reports US 82-35 and US 86-37, and Japanese Laid-Open Patent Publication No. 63-260213 describe that the surface acoustic wave device has an IDT constructed of gold, silver or platinum, the device which was actually tested is a gold IDT. To generate the Love wave, the use of the abovedescribed heavy metals having large mass is thought to be required, but the use of a heavy metal is very costly.

According to Japanese Laid-Open Patent Publication No. 8-125485, the IDT is constructed of Ta or W, which are less costly than gold and which provide a low Q factor and a relatively high specific resistance, and can still work in a resonator but experiences great difficulties and disadvantages when used in a filter.

According to Japanese Laid-Open Patent Publication No. 8-250966, the IDT is constructed of a two-layered structure of Ta/Al, resulting in a decreased specific resistance. Even with the IDT of the two-layered structure of Ta/Al, the specific resistance is not sufficiently low, and satisfactory performance is not achieved when such a configuration is used as a filter.

SUMMARY OF THE INVENTION

To overcome the problems described above, the preferred embodiments of the present invention provide a surface acoustic wave device including an IDT electrode and/or a reflector and which has a low-cost construction without using an expensive heavy metal, provides a high Q factor and a low specific resistance, and achieves an excellent performance when the device is constructed as a resonator or a bandpass filter.

According to a preferred embodiment of the present invention, a surface acoustic wave device includes a surface acoustic wave substrate and an interdigital transducer provided on the surface acoustic wave substrate, wherein the interdigital transducer includes a tungsten layer and an aluminum layer. In such a preferred embodiment, it is preferable that the laminated metal film has a structure in which a tungsten layer and an aluminum layer are laminated together to form an integral metal film.

The aluminum layer may be provided on the surface acoustic wave substrate and the tungsten layer is then preferably provided on the aluminum layer. Alternatively, the tungsten layer may be provided on the surface acoustic wave substrate and the aluminum layer is then preferably provided on the tungsten layer.

The surface acoustic wave device may further comprise a pair of reflectors made of a laminated metal film in which a tungsten layer and an aluminum layer are laminated, the pair of reflectors being disposed on both sides of the interdigital transducer.

In another preferred embodiment of the present invention, a surface acoustic wave device includes a surface acoustic wave substrate, an interdigital transducer provided on the surface acoustic wave substrate and reflectors disposed on both sides of the interdigital transducer, wherein the reflectors include a tungsten layer and an aluminum layer. In such a preferred embodiment, it is preferable that the laminated metal film used to form the reflectors has a structure in which a tungsten layer and an aluminum layer are laminated together to form an integral metal film. In this preferred embodiment, the interdigital transducer may be preferably formed of aluminum or other suitable material.

The surface acoustic wave substrate in preferred embodiments of the present invention is preferably a Y-cut, X-propagated $LiNbO_3$ substrate, and the surface acoustic wave device is constructed to use Love waves.

The surface acoustic wave device may further comprise a bonding electrode provided on the surface acoustic wave substrate and connected to the interdigital transducer. The bonding electrode may include a laminated metal film in which a tungsten layer and an aluminum layer are laminated together.

Alternatively, the bonding electrode may have a top layer made of aluminum. In this case, the bonding electrode includes a single layer made of aluminum which is therefore a top layer, or includes a top layer of aluminum disposed on top of a laminated metal film including an aluminum layer and a tungsten layer laminated together, such that the aluminum layer of the laminated metal layer is provided on the surface acoustic wave substrate and the top aluminum layer is provided on the tungsten layer of the laminated metal film.

For the purpose of illustrating the invention, there are shown in the drawings several embodiments and forms which are presently preferred, it being understood, however, that the invention is not limited to the precise arrangements and instrumentalities shown therein.

DETAILED DESCRIPTION OF PREFERRED EMBODIMENTS

Hereinafter, preferred embodiments of the present invention are explained in detail with reference to the drawings.

Figure 1:
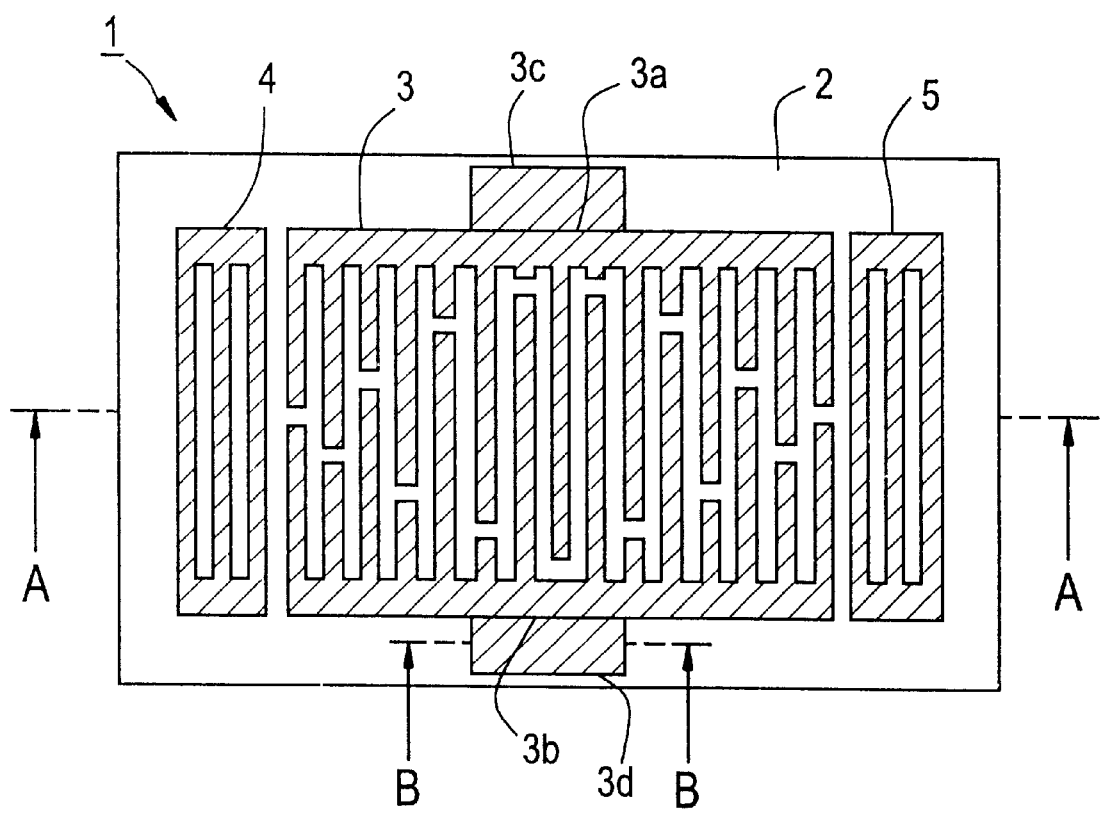
FIG. 1 is a diagrammatic plan view showing a surface acoustic wave device according to a first preferred embodiment of the present invention.

FIG. 1 is a schematic plan view showing the surface acoustic wave device according to a first preferred embodiment of the present invention, and FIG. 2 is an enlarged cross-sectional view showing part of the surface acoustic wave device taken along a line A—A in FIG. 1.

A surface acoustic wave device 1 preferably includes a surface acoustic wave substrate 2 of a Y-cut $LiNbO_3$ substrate.

An IDT electrode 3 is provided on the top surface of the surface acoustic wave substrate 2 and may be arranged to be located substantially at a center portion of the substrate 2. The IDT electrode 3 includes a comb-shaped electrode 3a having a plurality of electrode fingers and a comb-shaped electrode 3b having a plurality of electrode fingers, in which the two combshaped electrodes 3a and 3b are interdigitated with each other. The IDT electrode 3 is preferably subjected to apodization.

The plurality of electrode fingers of the IDT electrode 3 extends in a direction that is substantially perpendicular to an X-axis so that Love waves, which are generated as surface acoustic waves in the device 1, propagate in the direction of the X-axis on the $LiNbO_3$ substrate 2.

Reflectors 4 and 5 are preferably arranged on both sides of the IDT electrode 3 in the direction of propagation of the surface acoustic wave. Each of the reflectors 4 and 5 has a plurality of electrode fingers which are short-circuited with each other. The reflectors 4 and 5 also extend in a direction that is substantially perpendicular to the X-axis.

The surface acoustic wave device 1 of this preferred embodiment is preferably constructed such that each of the IDT electrode 3 and reflectors 4 and 5 is made of a laminated metal film in which an aluminum layer and a tungsten layer are laminated preferably in that order. Specifically, the IDT electrode 3 is preferably constructed of a laminated metal film 12 in which a tungsten layer 11 is laminated on top of an aluminum layer 10, as shown in a cross-sectional view of part of the IDT electrode 3 in FIG. 2A.

Figure 2A:
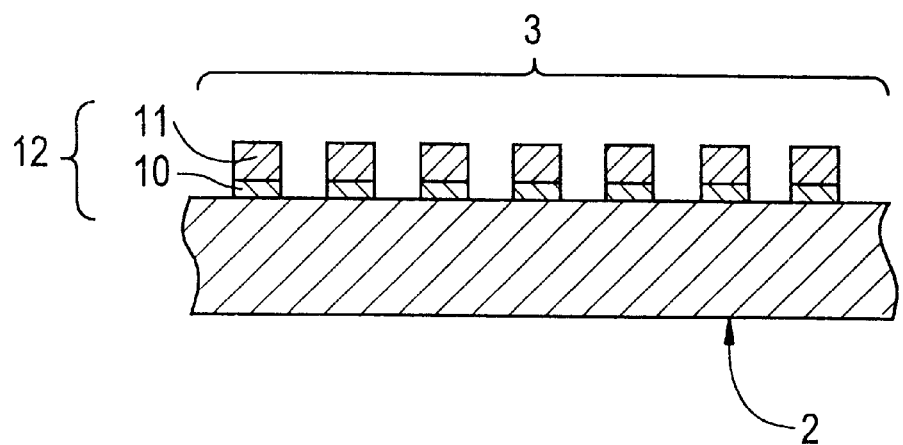
FIG. 2A is an enlarged cross-sectional view showing part of the device taken along a line A—A in FIG. 1.
Figure 2B:
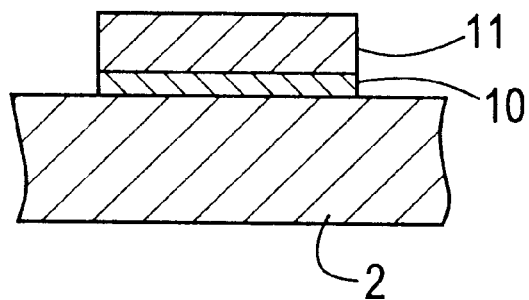
FIG. 2B is an enlarged cross-sectional view showing part of the device taken along a line B—B in FIG. 1.

The comb-shaped electrodes 3a and 3b may respectively be connected to bonding electrodes 3c and 3d to which bonding wires (not shown) are to be connected. As shown in FIG. 2B, the bonding electrodes 3c and 3d are also preferably constructed of the laminated metal film 12. That is, the bonding electrodes 3c and 3d are preferably constructed to include the aluminum layer 10 on the surface acoustic wave substrate 2 and the tungsten layer 11 on the aluminum layer 10.

Figure 2C:
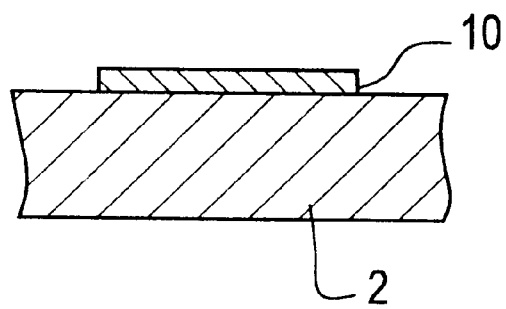
FIG. 2C is an enlarged cross-sectional view showing part of the device taken along a line B—B in FIG. 1 according to a modification of the first preferred embodiment.
Figure 2D:
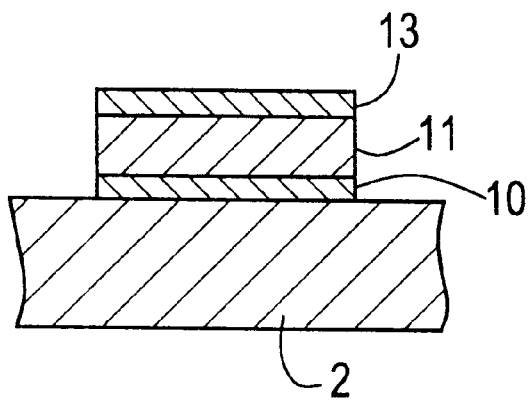
FIG. 2D is an enlarged cross-sectional view showing part of the device taken along a line B—B in FIG. 1 according to another modification of the first preferred embodiment.

It may be somewhat difficult for the connecting electrodes 3c and 3d to establish excellent contact or bonding with bonding wires due to the existence of the tungsten layer 11 disposed at the outer surface thereof. In such a case, it is preferable to construct the bonding electrodes 3c and 3d so that each of the bonding electrodes 3c and 3d has a top layer made of aluminum. For example, as shown in FIG. 2C, the bonding electrodes 3c and 3d may have only the aluminum layer 10 by not providing the tungsten layer 11 on the aluminum layer 10. Alternatively, another aluminum layer 13 may be provided on the tungsten layer 11 which is disposed on the aluminum layer 10, as shown in FIG. 2D, such that the tungsten layer 11 is disposed between the two aluminum layers 10, 13.

According to the first preferred embodiment of the present invention, since the surface acoustic wave device 1 has the IDT electrode 3 and reflectors 4 and 5 each having the laminated metal film having the construction described above, a surface acoustic wave device with a high Q factor and a small resonance resistance is provided when a voltage is applied to the IDT electrode 3 for generating resonance. This operation is now discussed referring to a specific example.

An example of the preferred embodiments of the surface acoustic wave device 1 was manufactured according to the following procedure. An Al layer having a thickness of about 50 nm and a tungsten layer having a thickness of about 300 nm were formed in that order along the entire top surface of the surface acoustic wave substrate 2 made of the Y-cut $LiNbO_3$ material, using a sputtering technique. A photoresist was applied on the laminated metal film thus formed using a spin coating technique, and was then subjected to exposure and development using a photomask.

An etchant was used to remove the portion of the laminated metal film other than portions where the IDT electrode 3 and reflectors 4 and 5 were to be formed. The etchant that was used in the etching operation was prepared by mixing 63% by weight of hydroflouric acid, nitric acid and pure water with a ratio of 1:2:1.

The width of each electrode finger and the pitch between the electrode fingers in the IDT electrode 3 were designed so that the Love wave had a wavelength λ of about λ=12 μm, and the number of pairs of electrode fingers in the IDT electrode 3 was set to be 50, and the weighted interdigital coextensive lengths were set to be generally rhomboid as shown in FIG. 1. The reflectors 4 and 5 had the electrode finger width and electrode finger pitch for the same wavelength of the IDT electrode 3, and the number of electrode fingers was 10 in each reflector.

Figure 3:
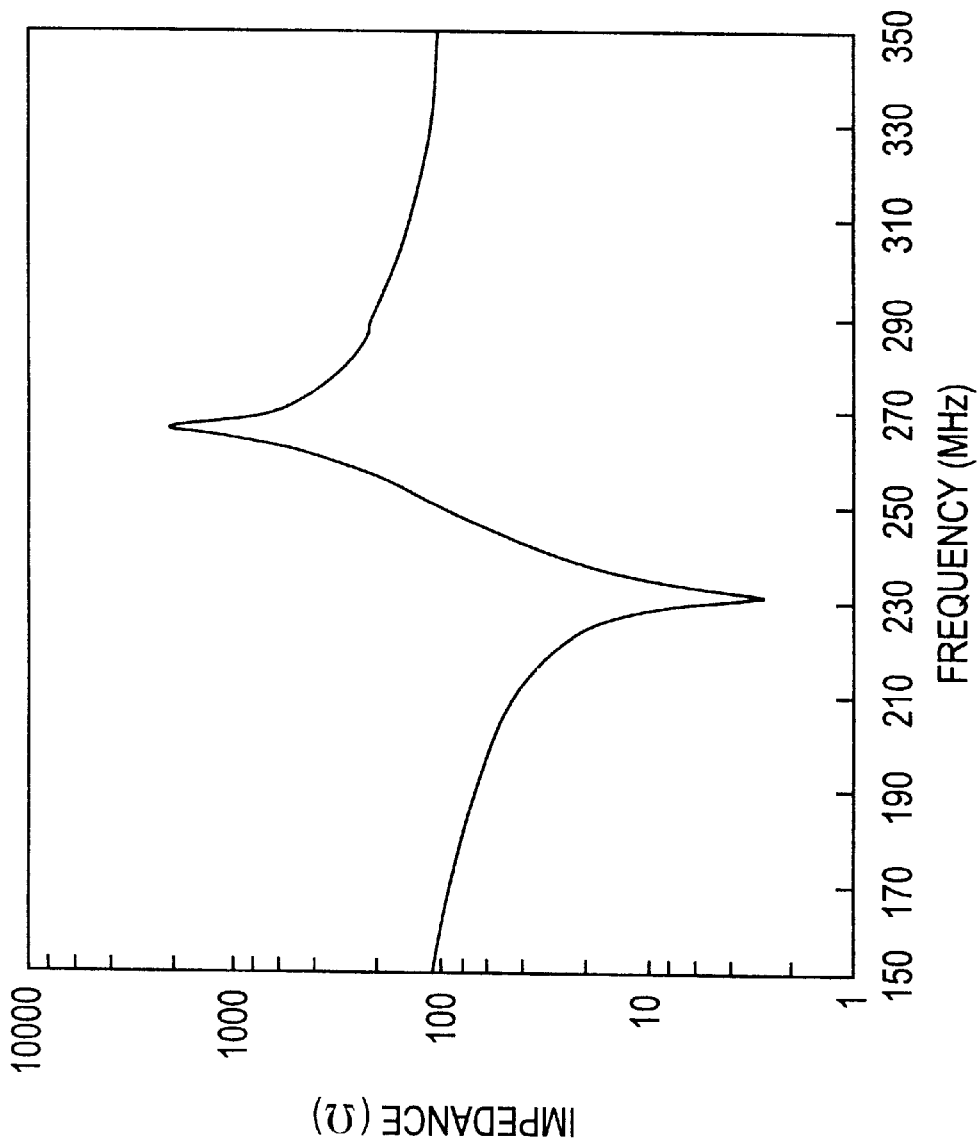
FIG. 3 shows the impedance-frequency characteristics of the surface acoustic wave device of the first preferred embodiment.

The impedance-frequency characteristics of the surface acoustic wave device 1 of this example of preferred embodiments thus constructed are shown in FIG. 3. As shown, the impedance at a resonance frequency is 2.73 Ω, while the impedance at an anti-resonance frequency is 2.13 kΩ.

For comparison, two types of conventional surface acoustic wave devices, having an electrode material and construction that are different from the electrode material and construction for the surface acoustic wave device 1, were manufactured so that the remaining physical characteristics, compositions and conditions were the same as that in the example of the preferred embodiments described above.

A first conventional device was manufactured in the same manner as the above surface acoustic wave device according to an example of preferred embodiments of the present invention, except that a tantalum layer was formed via a sputtering technique, instead of the tungsten layer in the above-described example of preferred embodiments of the surface acoustic wave device, with the tantalum layer in the first conventional device having the same thickness as that of the tungsten layer of the example of preferred embodiments of the present invention. The impedance-frequency characteristics of the first conventional device are shown in FIG. 4.

A second conventional device was manufactured by sputtering tungsten on a surface acoustic wave substrate to form a tungsten layer of 350 nm. The IDT electrode 3 and reflectors 4 and 5 were formed of only a tungsten layer in the second conventional device. The impedance-frequency characteristics of the second conventional device are shown in FIG. 5.

Figure 4:
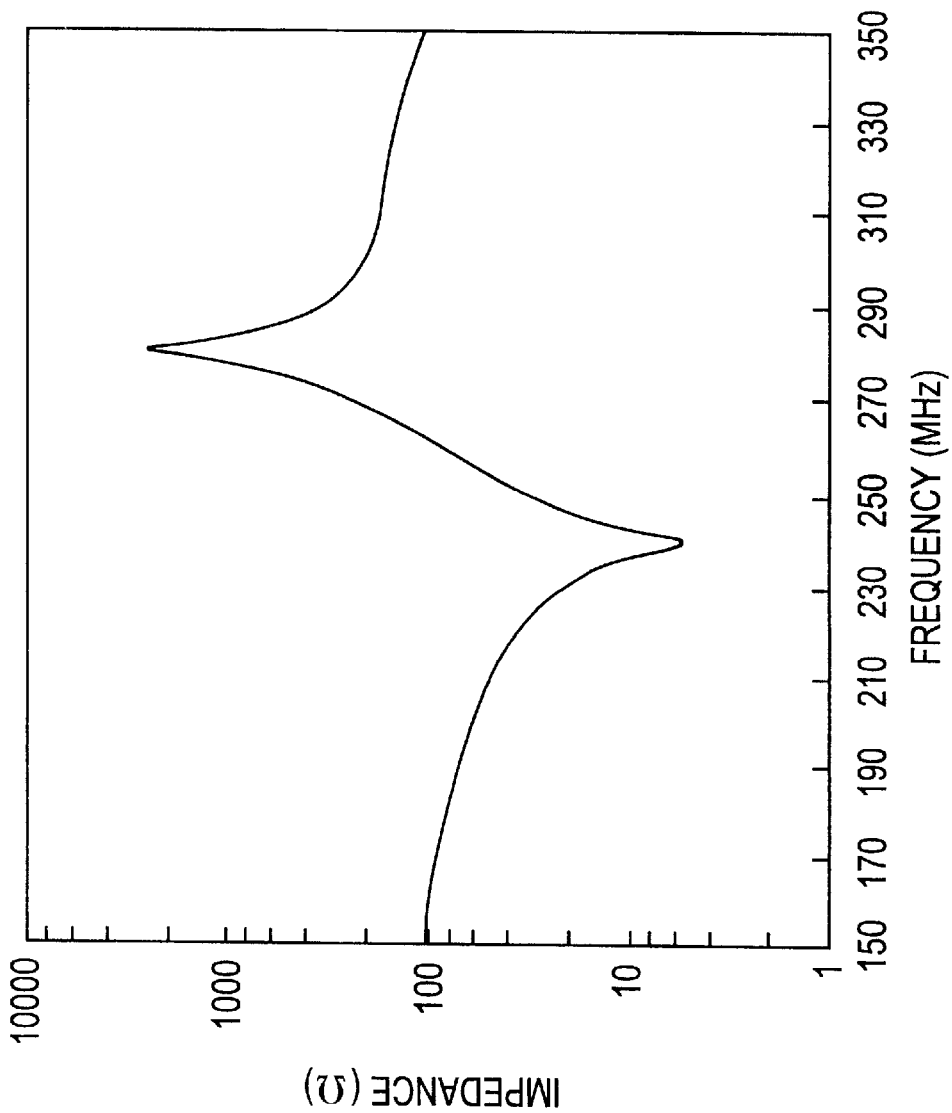
FIG. 4 shows the impedance-frequency characteristics of a first conventional device.
Figure 5:
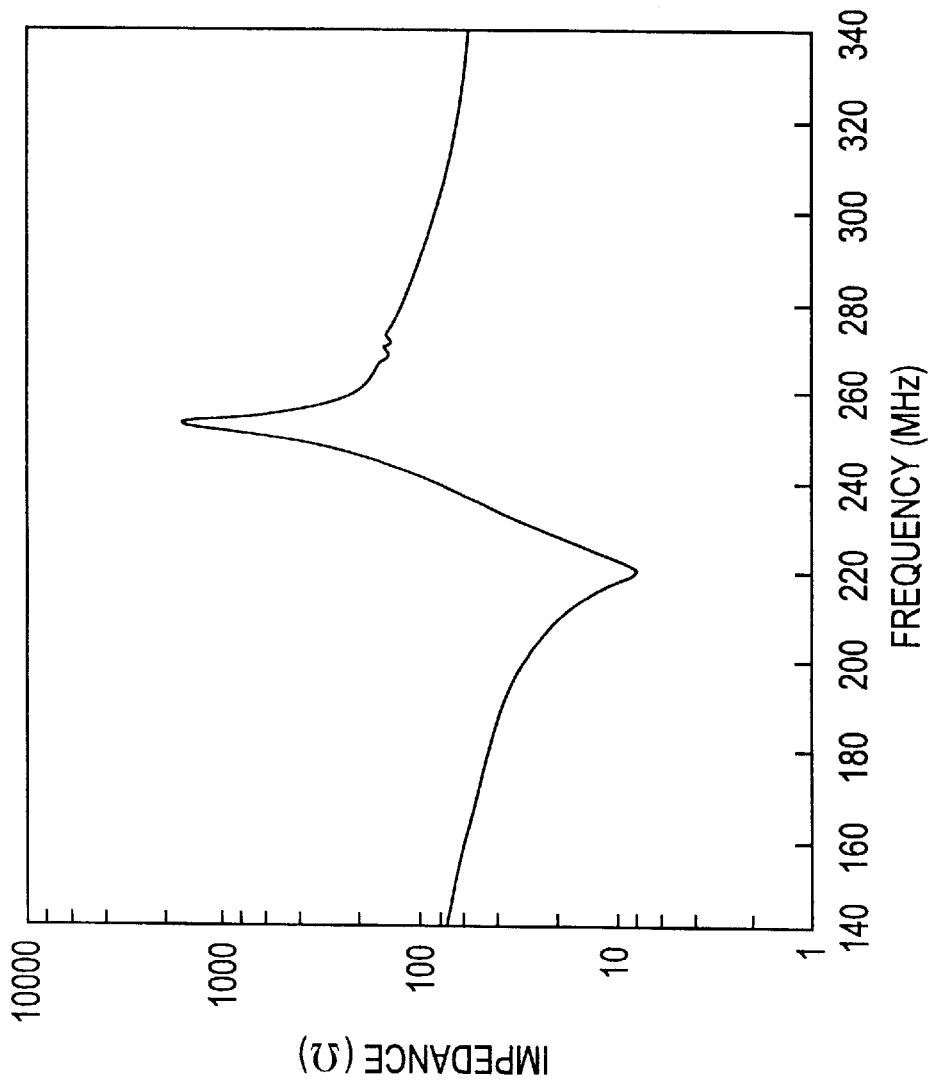
FIG. 5 shows the impedance-frequency characteristics of a second conventional device.

As seen from FIG. 4 and FIG. 5, the first conventional device in which the IDT electrode 3 and reflectors 4 and 5 were constructed of Ta/Al laminated metal film provided a resonance resistance of 5.46 Ω and an anti-resonance resistance of 2.42 kΩ, and the second conventional device provided a resonance resistance of 7.73 Ω and an anti-resonance resistance of 1.51 kΩ.

As understood from the comparison of the impedance-frequency characteristics of the surface acoustic wave device of the example of the preferred embodiments shown in FIG. 3 with the impedance-frequency characteristics of the conventional devices shown in FIG. 4 and FIG. 5, the IDT electrode 3 and reflectors 4 and 5, which are constructed of the laminated metal film of W/Al according to the example of preferred embodiments of the present invention, provide a lower resonance resistance than any case of the Ta/Al laminated metal film structure and the tungsten-only structure according to the conventional examples. By constructing the IDT electrode 3 and reflectors 4 and 5 of the laminated metal film in which the aluminum layer and the tungsten layer are laminated together according to preferred embodiments of the present invention, a high Q factor and a significantly lower resonance resistance are achieved. The surface acoustic wave device 1 according to preferred embodiments of the present invention is preferably used for a piezoelectric resonance component such as a resonator and a bandpass filter using Love waves.

Generally speaking, the reflectors 4 and 5, which are constructed of a large mass electrode material, increases the reflection coefficient per reflector. Additionally, the reflectors 4 and 5 preferably constructed of the W/Al laminated metal film reduces the number of electrode fingers in each reflector. With this arrangement, a compact surface acoustic wave device including a reflector is thus provided.

The IDT electrode 3 constructed of the W/Al laminated metal film according to preferred embodiments of the present invention provides a low resonance resistance compared with the IDT electrode of the Ta/Al laminated metal film according to the conventional device, because the specific resistance of Ta is 12.3 Ω·m while the specific resistance of W is as small as 4.9 Ω·m. It is also considered unlikely that side etching occurs during wet etching when the IDT constructed according to preferred embodiments of the present invention is formed through photolithography. This is discussed referring to FIG. 6 and FIG. 7.

Figure 6:
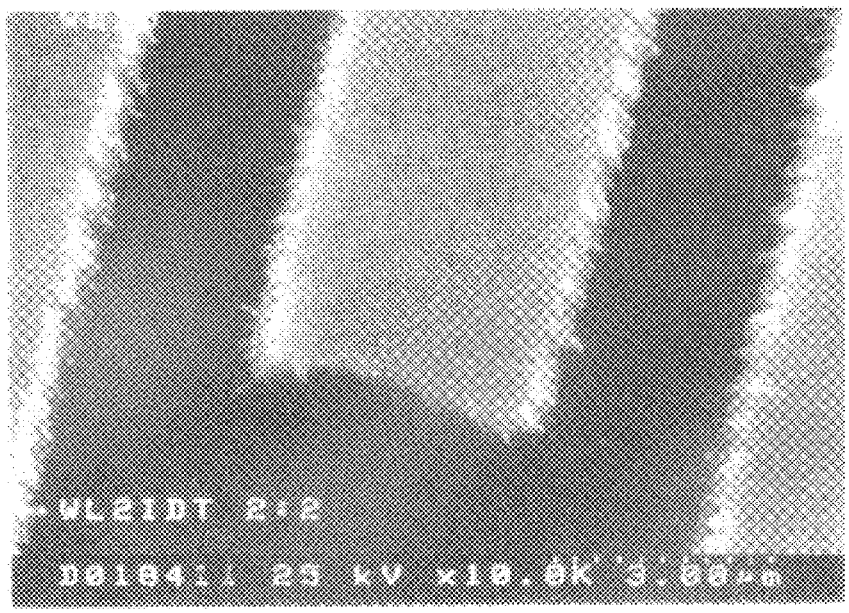
FIG. 6 is a photograph taken by a scanning electron microscope which shows the surface state of the IDT electrode of the surface acoustic wave device according to preferred embodiments of the present invention.

FIG. 6 is a photograph taken by a scanning electron microscope showing major portions of the IDT electrodes of the surface acoustic wave devices constructed according to preferred embodiments as described above, and FIG. 7 is the photograph taken by the scanning electron microscope of the IDT electrode of the first conventional device that uses the Ta/Al laminated metal film.

Figure 7:
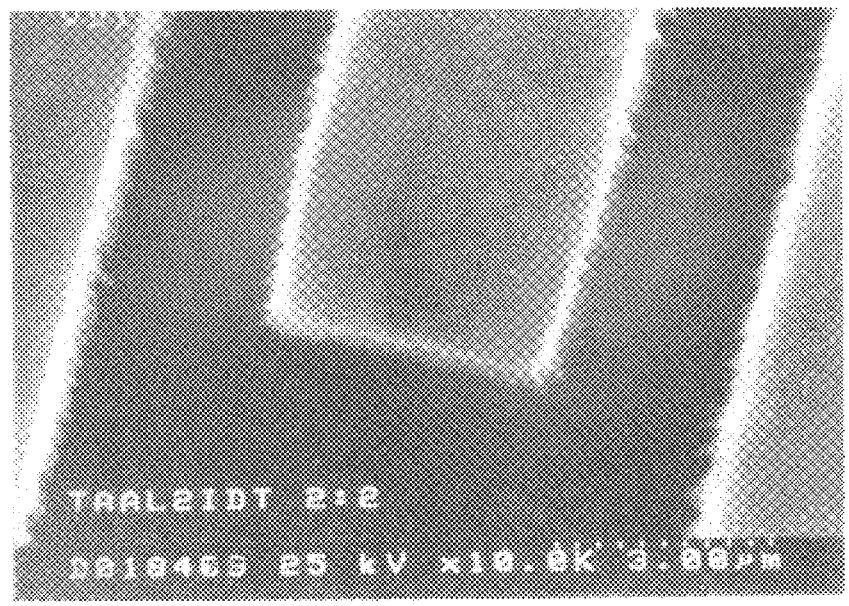
FIG. 7 is a photograph taken by a scanning electron microscope which shows the surface state of the IDT electrode of the first conventional device.

As seen from the comparison of FIG. 6 with FIG. 7, a small surface irregularity is observed on the surface of the tungsten layer, namely on the surface of laminated metal film in the IDT electrode of the W/Al laminated metal film according to preferred embodiments of the present invention. In contrast, such irregularity is substantially less on the surface of the IDT electrode of the Ta/Al laminated metal film. Because of its surface irregularity, the IDT electrode of the W/Al laminated metal film according to preferred embodiments of the present invention increases the adhesive strength of the photoresist thereby preventing side etching from occurring during the wet etching process, and the side surface of each electrode finger is closer to the surface acoustic wave substrate in a direction that is substantially perpendicular to the surface acoustic wave substrate.

In the IDT electrode of the Ta/Al laminated metal film according to the conventional example, such irregularity is so small as to be negligible, and the adhesive strength of the photoresist is low such that side etching is likely to occur during the wet etching process. As a result of such side etching, the electrode side surface is tapered at a large angle with respect to a direction that is substantially perpendicular to the surface acoustic wave substrate. Consequently, the electrode finger becomes substantially trapezoidal in cross section.

Thus, the surface acoustic wave device of preferred embodiments of the present invention having the IDT electrode constructed of the W/Al laminated metal film prevents side etching from occurring, thereby increasing the Q factor and lowering the resonance resistance.

Figure 8:
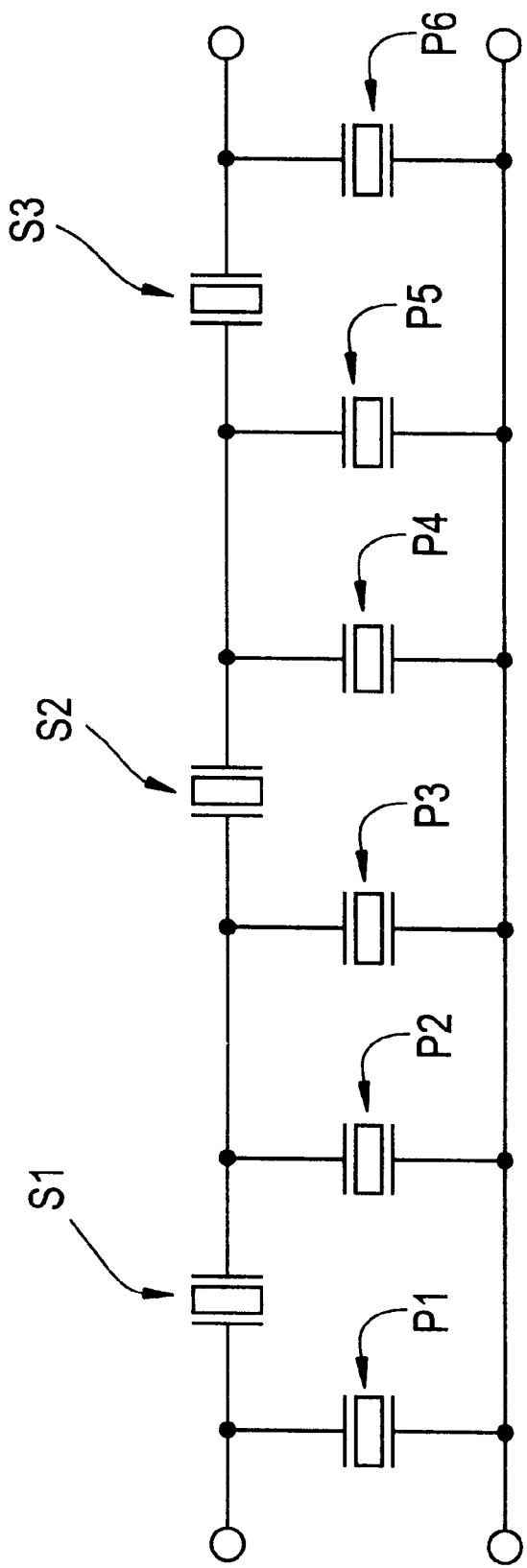
FIG. 8 is a equivalent circuit showing the ladder filter according to a second preferred embodiment.

The surface acoustic wave device of preferred embodiments of the present invention can be applied not only in a surface acoustic wave resonator but also in a large number of piezoelectric resonance components such as a bandpass filter. A second preferred embodiment is an embodiment in which the present invention is implemented in a ladder filter shown in FIG. 8. FIG. 8 shows the schematic diagram of the ladder filter, wherein three serial resonators S1 to S3 are connected in series in a series arm connecting an input to an output. Six parallel resonators P1~P6 are connected between the series arm and the ground potential. Specifically, three π-type filters are provided in a ladder filter, in which each π-type filter is made up of a single serial resonator and two parallel resonators on both sides of the serial resonator.

The ladder filter in the second preferred embodiment uses the surface acoustic wave device 1 shown in FIG. 1 for the serial resonators S1 to S3 and the parallel resonators P1 to P6, which are configured as shown in FIG. 8. The ladder filter thus constructed provides the attenuation-frequency characteristics as shown in FIG. 9.

Figure 10:
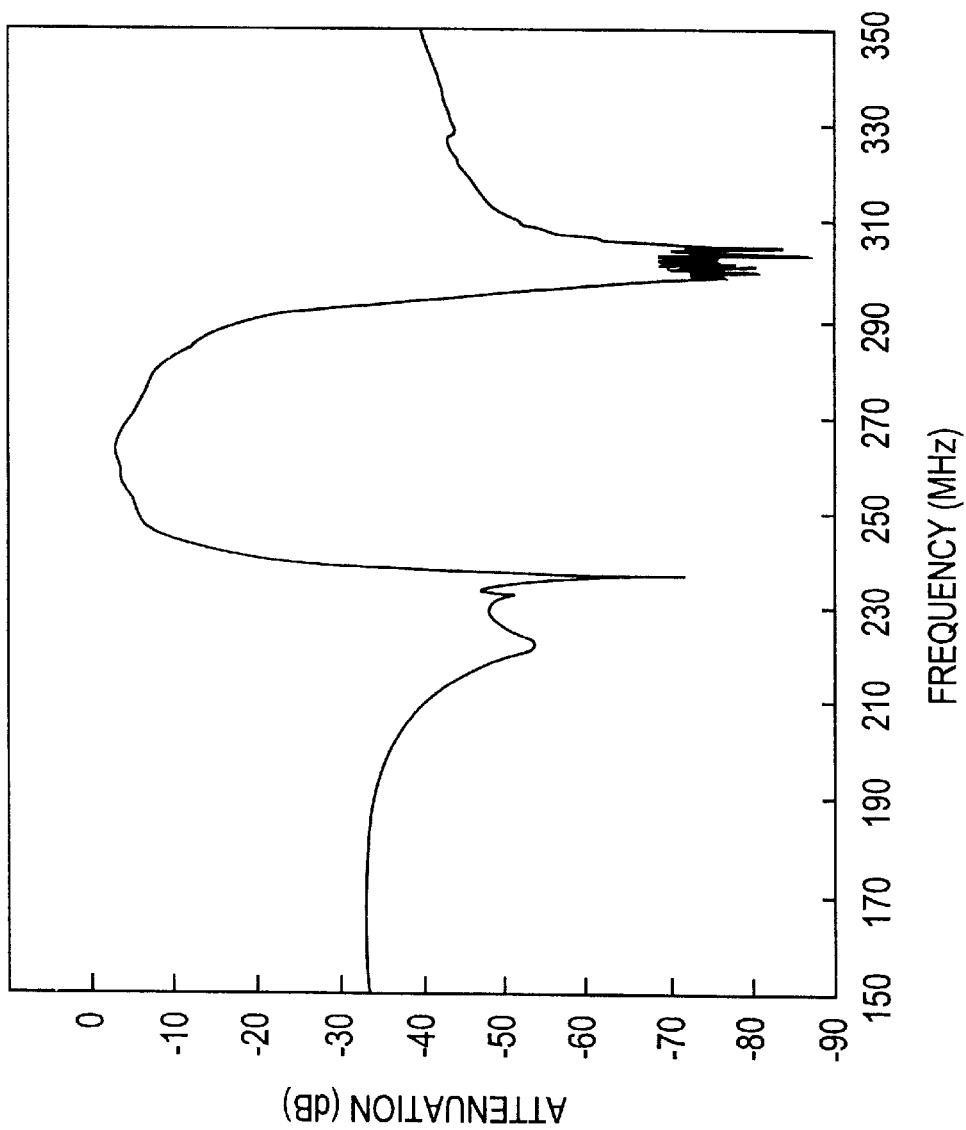
FIG. 10 shows, for comparison, the attenuation-frequency characteristics of the ladder filter which is constructed of the first conventional surface acoustic wave device.
Figure 11:
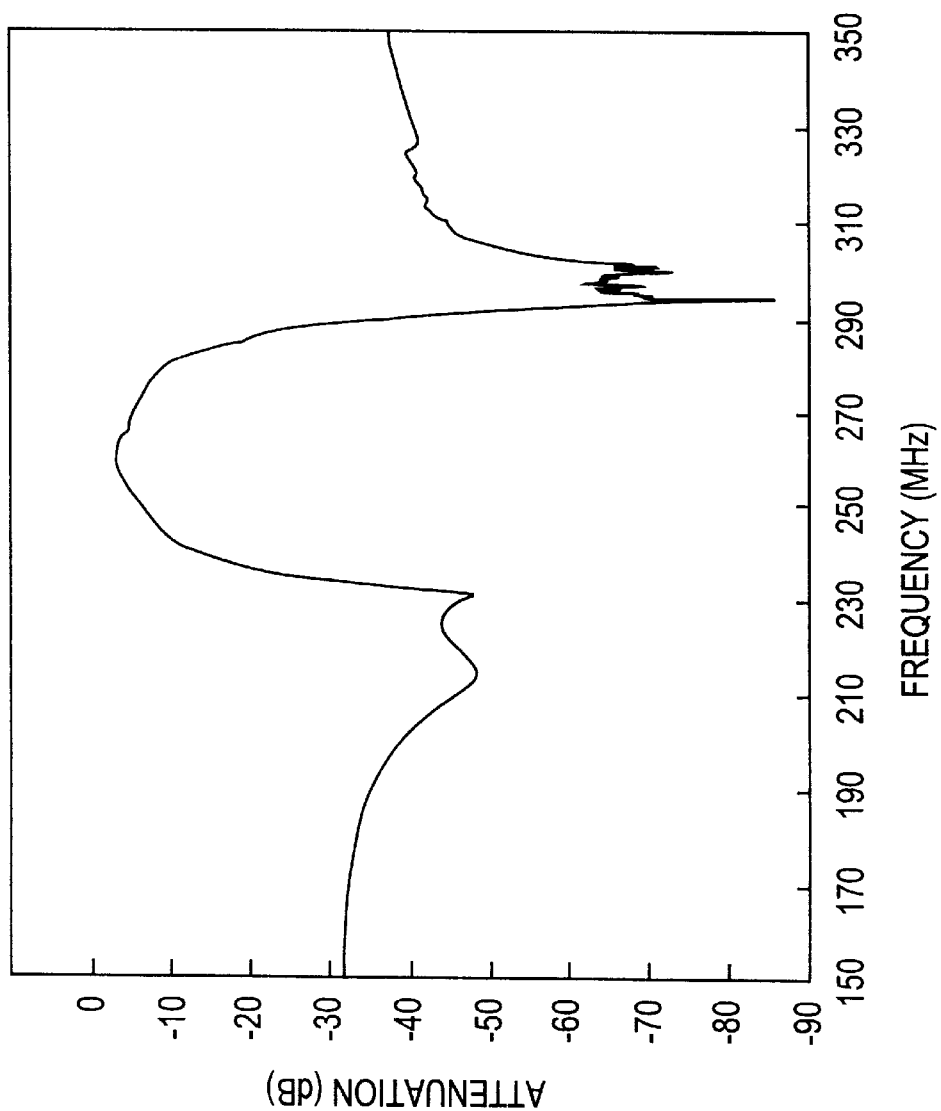
FIG. 11 shows, for comparison, the attenuation-frequency characteristics of the ladder filter which is constructed of the second conventional surface acoustic wave device.

For comparison, FIG. 10 shows the attenuation-frequency characteristics of a ladder filter using the first conventional device, namely, the surface acoustic wave device that is constructed of the IDT electrode and reflector, each formed of the Ta/Al laminated metal film. FIG. 11 shows the attenuation-frequency characteristics of a ladder filter incorporating the second conventional device, namely, the surface acoustic wave device that includes the IDT electrode and reflector, each formed of the tungsten layer only.

Figure 9:
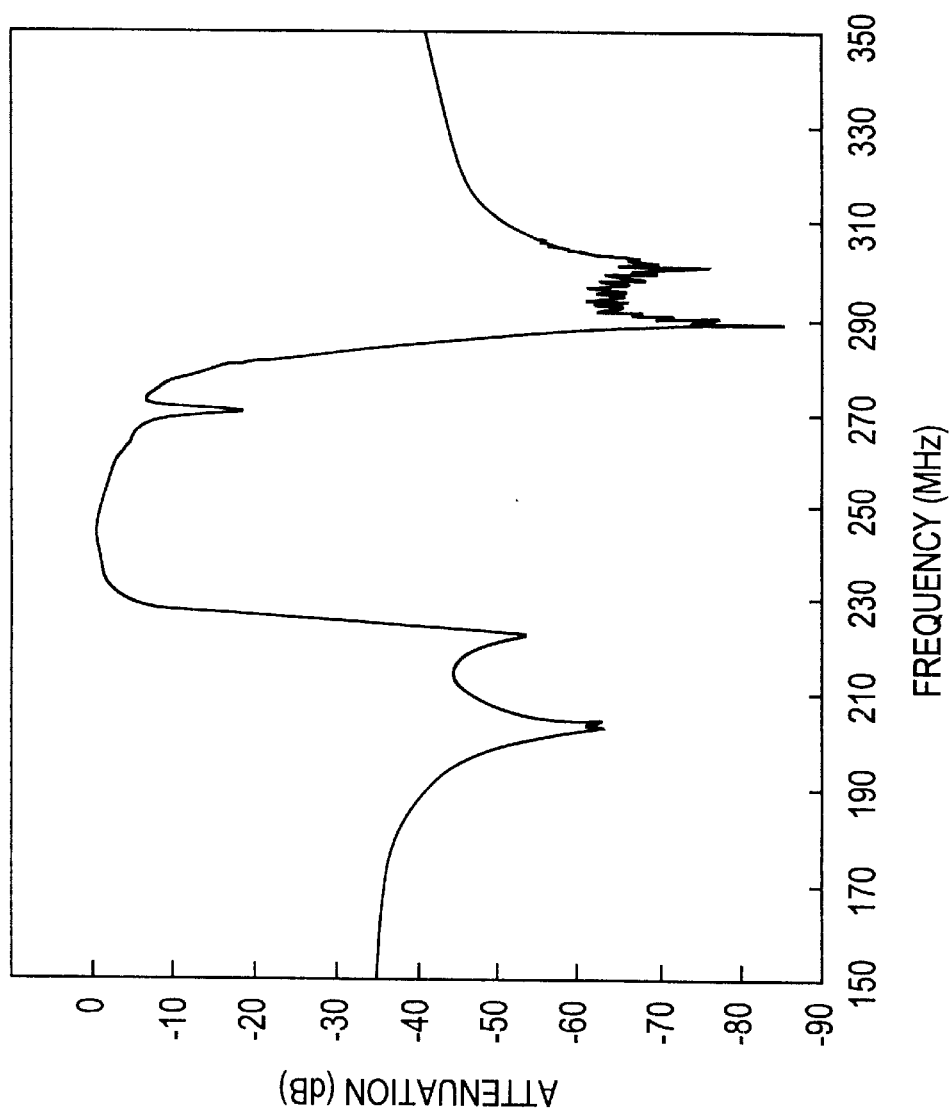
FIG. 9 shows the attenuation-frequency characteristics of the ladder filter of the second preferred embodiment.

As clearly seen from FIG. 9, the ladder filter of the second preferred embodiment of the present invention results in a minimum insertion loss of 1.17 dB. In contrast, the ladder filter incorporating the first conventional surface acoustic wave device has a minimum insertion loss of 2.69 dB, and the ladder filter incorporating the second conventional surface acoustic wave device has a minimum insertion loss of 3.14 dB.

The ladder filter incorporating the surface acoustic wave device 1 according to preferred embodiments of the present invention achieves a significantly lower insertion loss, compared with the ladder filters respectively incorporating the first and second conventional surface acoustic wave devices. This is because the Q factor of each surface acoustic wave device defining the ladder filter is increased and because the resonance resistance of each surface acoustic wave device is decreased in the preferred embodiments of the present invention.

The insertion loss is thus efficiently lowered by constructing a bandpass filter of a plurality of surface acoustic wave devices arranged according to preferred embodiments of the present invention.

As already described, when the reflectors 4 and 5 are constructed of a large mass electrode material, the reflection coefficient per reflector is increased, reducing the number of electrode fingers required in each reflector. Since a resonance filter such as the above ladder filter works with a reduced number of electrode fingers in the reflector, the entire filter is constructed to be much more compact than conventional filters.

The surface acoustic wave device 1 of the first preferred embodiment incorporates the laminated metal film in which the aluminum layer and the tungsten layer in that order are laminated on the surface acoustic wave substrate 2, but the IDT electrode may be constructed of the laminated metal film in which the tungsten layer and the aluminum layer in that order are laminated on the surface acoustic wave substrate, and it was also discovered that such a surface acoustic wave device increases the Q factor and decreases the resonance resistance. In such a case, although the surface of the laminated metal film is made of the aluminum layer, the tungsten layer having a small irregularity on its surface causes an irregularity on the surface of the aluminum layer disposed on top of the tungsten layer, increasing the bonding strength of the photoresist, and thereby preventing side etching during the wet etching.

The ratio of the thicknesses of the tungsten layer and the aluminum layer is preferably as follows: the tungsten layer thickness to the aluminum layer thickness=10:1 to about 2:1, and in this case, the range of the ratio is not dependent on which layer is arranged to be a top layer. The aluminum layer, if too thick and outside of the above range, fails to fully exploit the effect of the lamination of the tungsten layer for improving the Q factor, and conversely, the aluminum layer, if too thin and outside of the above range, fails to fully exploit the resonance resistance lowering feature.

The reflection of the surface acoustic wave from the electrode finger of the IDT electrode may be utilized to increase the trapping efficiency of the surface acoustic wave in the IDT electrode 3, and in such a case, the reflectors 4 and 5 are dispensed with. In other words, the reflectors 4 and 5 are not necessarily required in the surface acoustic wave device of preferred embodiments of the present invention.

In such a preferred embodiment, the IDT electrode 3, having a structure including the laminated film of tungsten and aluminum, is provided on the substrate 2 without being surrounded by any reflectors.

Although the surface acoustic wave substrate 2 is preferably constructed of the Y-cut, X-propagated $LiNbO_3$ substrate in the above preferred embodiments, the material of the surface acoustic wave substrate 2 is not limited to this, and other piezoelectric single crystal substrates with other cut angles and other propagation directions, for example, rotational Y-cut, X-propagated $LiNbO_3$, rotational Y-cut, X-propagated $LiTaO_3$, and rotational Y-cut crystal, may be used.

Although the surface acoustic wave device 1 of the first preferred embodiment has the IDT electrode 3 and reflectors 4 and 5, each of which is constructed of the laminated metal film in which the aluminum layer and the tungsten layer are laminated in that order, the surface acoustic wave device 1 may have the reflectors 4 and 5 constructed of the above-described laminated metal film but with the IDT electrode 3 constructed of a material other than the above-described laminated metal film having the laminated arrangement of the tungsten layer and the aluminum layer.

The IDT electrode may be formed of a single metal layer such as aluminum which is commonly used as an electrode material in the surface acoustic wave device, and only the reflectors 4 and 5 may be constructed of the laminated metal film including the tungsten and aluminum layers. In this case, the reflection coefficient of the reflectors 4 and 5 of the above laminated metal film is increased, permitting a compact design and arrangement of the reflectors 4 and 5, and thereby permitting a compact design and arrangement of the entire surface acoustic wave device.

When only the reflectors 4 and 5 are constructed of the laminated metal film as described above, the tungsten layer and the aluminum layer may be formed in that order on the surface acoustic wave substrate.

Since the reflector, constructed of the laminated metal film of the aluminum layer and the tungsten layer, produces a high reflection coefficient, permitting a compact design and arrangement of the reflector and consequently, of the surface acoustic wave device, the reflector has applications not only in the surface acoustic wave device 1 shown in FIG. 1 but also in known conventional surface acoustic wave devices with reflectors. For example, a surface acoustic wave filter with a reflector utilizing the Rayleigh wave may be made much more compact by constructing the reflector of the above-described laminated metal film.

In yet another preferred embodiment, only the IDT electrode 3 may have the laminated metal film construction including the laminated tungsten and aluminum layers, and the reflectors 4, 5 may be formed of some conventional material such as aluminum only.

As has been explained above, since the surface acoustic wave device of preferred embodiments of the present invention has the IDT electrode that is constructed of the laminated metal film in which the tungsten layer and the aluminum layer are laminated together, the surface acoustic wave device achieves an increased Q factor and a low resonance resistance. This arrangement provides a surface acoustic wave device which has applications in a variety of piezoelectric resonance components including a piezoelectric resonator and a bandpass filter, using Love waves. Since the use of the laminated metal film results in an increased reflection coefficient of the electrode finger, the IDT electrode has a substantially reduced and thin thickness compared with the IDT electrode of Al only, and machining of the electrode finger is easy. The cost of the surface acoustic wave device is reduced, because there is no need for the use of expensive and heavy metals such as gold, silver and platinum.

The laminated metal film of the tungsten layer and the aluminum layer may be formed through reactive ion etching. Specifically, it is very difficult to form the tantalum layer via reactive ion etching, while the tungsten layer is preferably formed in a plasma of fluorine-based gas through reactive ion etching, and the Al layer is preferably formed in a plasma of chlorine-based gas through reactive ion etching. In order to construct the IDT electrode of the tungsten layer and the aluminum layer, the same vacuum chamber may be used with the gas replaced, and the laminated metal film is easily formed through reactive ion etching. According to preferred embodiments of the present invention, the IDT electrode is efficiently formed through reactive ion etching while a wide choice of electrode forming techniques is available.

In the case where the surface acoustic wave substrate has thereon the IDT electrode in which the aluminum layer and the tungsten layer are preferably laminated together in that order, the tungsten layer has, on its surface, a small irregularity. Thus, the adhesive strength of the photoresist in photolithography is increased by the small irregularity, effectively preventing side etching during the wet etching. The Q factor is therefore increased and the resonance resistance is thus lowered.

In the case where the surface acoustic wave substrate has thereon the IDT electrode in which the tungsten layer and the aluminum layer are laminated together in that order, the tungsten layer having a small irregularity on its surface causes an irregularity on the surface of the aluminum layer disposed on top of the tungsten layer. Therefore, the adhesive strength of the photoresist is significantly increased, thereby controlling side etching during the wet etching. As a result, the Q factor is thus increased and the resonance resistance is thus lowered.

When the reflector constructed of the laminated metal film in which the tungsten layer and the aluminum layer are laminated together in that order is further provided, the reflection coefficient is significantly increased and the number of electrode fingers in the reflector is significantly reduced. Thus, the surface acoustic wave device with the reflector is extremely compact, compared with the conventional surface acoustic wave device.

In addition, when the surface acoustic wave substrate is made of the Y-cut, X-propagated LiNbO$_3$ substrate, a surface acoustic wave device having a low resonance resistance using Love waves can be provided.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device, comprising:

a surface acoustic wave substrate; and an interdigital transducer provided on the surface acoustic wave substrate and including a tungsten layer and an aluminum layer, wherein a ratio of a thickness of the tungsten layer to the aluminum layer is in a range of about 10:1 to about 2:1.

2. A surface acoustic wave device according to claim 1, wherein the tungsten layer and the aluminum layer are laminated together to define an integral laminated metal film.

3. A surface acoustic wave device according to claim 1, wherein the aluminum layer is provided on the surface acoustic wave substrate and the tungsten layer is provided on the aluminum layer.

4. A surface acoustic wave device according to claim 1, wherein the tungsten layer is provided on the surface acoustic wave substrate and the aluminum layer is provided on the tungsten layer.

5. A surface acoustic wave device according to claim 1, further comprising a pair of reflectors disposed on opposing sides of the interdigital transducer.

6. A surface acoustic wave device according to claim 5, wherein at least one of the reflectors includes a tungsten layer and an aluminum layer.

7. A surface acoustic wave device according to claim 6, wherein the tungsten layer and the aluminum layer of the at least one of the reflectors are laminated together to define an integral laminated metal film.

8. A surface acoustic wave device according to claim 5, wherein each the reflectors includes a tungsten layer and an aluminum layer.

9. A surface acoustic wave device according to claim 8, wherein the tungsten layer and the aluminum layer of each of the reflectors are laminated together to define an integral laminated metal film.

10. A surface acoustic wave device according to claim 1, wherein the surface acoustic wave substrate is a Y-cut, X-propagated LiNbO$_3$ substrate.

11. A surface acoustic wave device according to claim 10, wherein the surface acoustic wave device is adapted to use a Love wave.

12. A surface acoustic wave device according to claim 1, further comprising a bonding electrode provided on the surface acoustic wave substrate and connected to the interdigital transducer, the bonding electrode including a tungsten layer and an aluminum layer.

13. A surface acoustic wave device according to claim 12, wherein the tungsten layer and the aluminum layer of the bonding electrode are laminated together to define an integral laminated metal film.

14. A surface acoustic wave device according to claim 1, further comprising a bonding electrode provided on the surface acoustic wave substrate and connected to the interdigital transducer, the bonding electrode having a top layer made of aluminum.

15. A surface acoustic wave device according to claim 1, further comprising a bonding electrode provided on the surface acoustic wave substrate and connected to the interdigital transducer, the bonding electrode including a top layer made of aluminum and a laminated metal film in which an aluminum layer and a tungsten layer are laminated together and arranged such that the aluminum layer of the laminated metal film is provided on the surface acoustic wave substrate and the top aluminum layer is provided on the tungsten layer of the laminated metal film.

16. A surface acoustic wave device, comprising:

a surface acoustic wave substrate;

an interdigital transducer provided on the surface acoustic wave substrate; and at least two reflectors disposed on opposite sides of the interdigital transducer, wherein at least one of the at least two reflectors is made of a different material than the interdigital transducer, and at least one of the at least two reflectors including a tungsten layer and an aluminum layer.

17. A surface acoustic wave device according to claim 16, wherein the tungsten layer and the aluminum layer are laminated together to define an integral laminated metal film.

18. A surface acoustic wave device according to claim 16, wherein each of the at least two reflectors includes a tungsten layer and an aluminum layer.

19. A surface acoustic wave device according to claim 18, wherein the tungsten layer and the aluminum layer of each of the at least two reflectors are laminated together to define an integral laminated metal film.

20. A surface acoustic wave device according to claim 16, wherein the interdigital transducer is made of aluminum.

* * * * *

UNITED STATES PATENT AND TRADEMARK OFFICE
CERTIFICATE OF CORRECTION

PATENT NO. : 6,271,617 B1
DATED : August 7, 2001
INVENTOR(S) : Toshimaro Yoneda and Michio Kadota It is certified that error appears in the above-identified patent and that said Letters Patent is hereby corrected as shown below:

<u>Title page,</u>
Item (*) Notice:, change "by 0 days" to -- by 36 days --.

Signed and Sealed this

Twentieth Day of August, 2002

Attest:

JAMES E. ROGAN
*Attesting Officer*   *Director of the United States Patent and Trademark Office*